United States Patent
Graessner

(10) Patent No.: US 7,548,638 B2
(45) Date of Patent: Jun. 16, 2009

(54) METHOD AND MAGNETIC RESONANCE IMAGING APPARATUS FOR AUTOMATICALLY DETERMINING THE SAGITTAL PLANE OF A SUBJECT

(75) Inventor: Joachim Graessner, Bönningstedt (DE)

(73) Assignee: Siemens Aktiengesellschaft, Munich (DE)

( * ) Notice: Subject to any disclaimer, the term of this patent is extended or adjusted under 35 U.S.C. 154(b) by 763 days.

(21) Appl. No.: 11/066,016

(22) Filed: Feb. 25, 2005

(65) Prior Publication Data

US 2005/0197562 A1 Sep. 8, 2005

(30) Foreign Application Priority Data

Feb. 27, 2004 (DE) ................... 10 2004 009 658

(51) Int. Cl.
*G06K 9/00* (2006.01)
(52) U.S. Cl. ...................................... 382/128; 600/410
(58) Field of Classification Search ................ 382/128; 324/320; 600/587, 410; 128/898

See application file for complete search history.

(56) References Cited

U.S. PATENT DOCUMENTS

| 5,427,100 | A | 6/1995 | Higashi et al. |
| 6,195,409 | B1* | 2/2001 | Chang et al. ............... 378/20 |
| 2002/0188190 | A1* | 12/2002 | Kassai et al. ............ 600/410 |

OTHER PUBLICATIONS

Terajima et al., "Anatomical Coordinate System for 3-D Knee Motion Analysis and Leg Alignment Assesment", Jul. 1998, Journal of Biomechanics, vol. 31, pp. 81.*
"Robust Midsagittal Plane Extraction from Normal and Pathological 3-D Neuroradiology Images," Liu et al., IEEE Trans., on Medical Imaging, vol. 20, No. 3 Mar. 2001, pp. 175-192.
"Automatic Extraction of the Central Symmetry (Mid-Sagittal) Plane Neuroradiology Images," Liu et al. The Robotics Institute, Carnegie Mellon University (1996).

* cited by examiner

*Primary Examiner*—John B Strege
(74) *Attorney, Agent, or Firm*—Schiff Hardin LLP

(57) ABSTRACT

In a method and magnetic resonance apparatus for the automatic determination of the sagittal plane in the examination region of an object, an essentially coronal localizer image exposure of the examination region is acquired, from which the sagittal plane is determined by an automatic image assessment by the image-processing unit of the magnetic resonance apparatus.

15 Claims, 4 Drawing Sheets

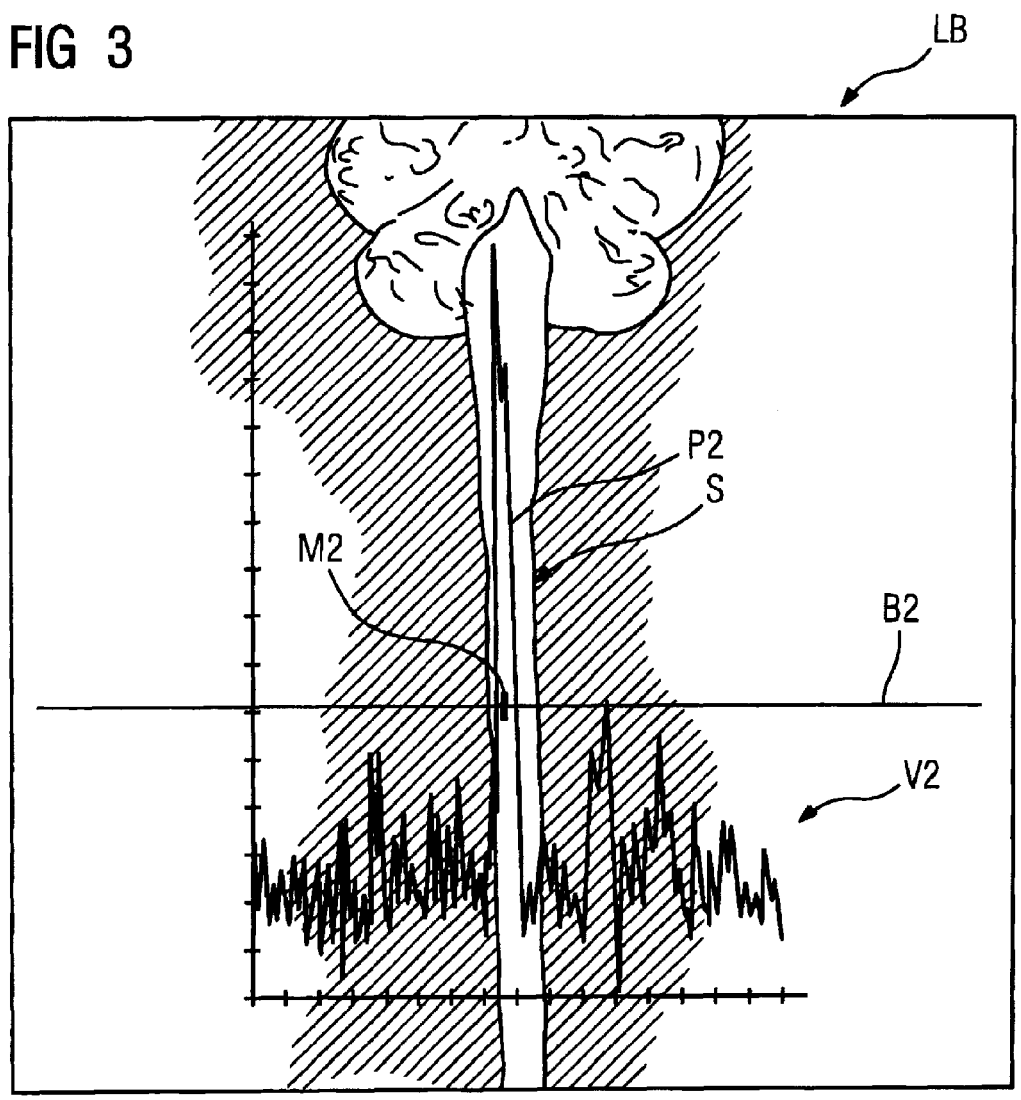

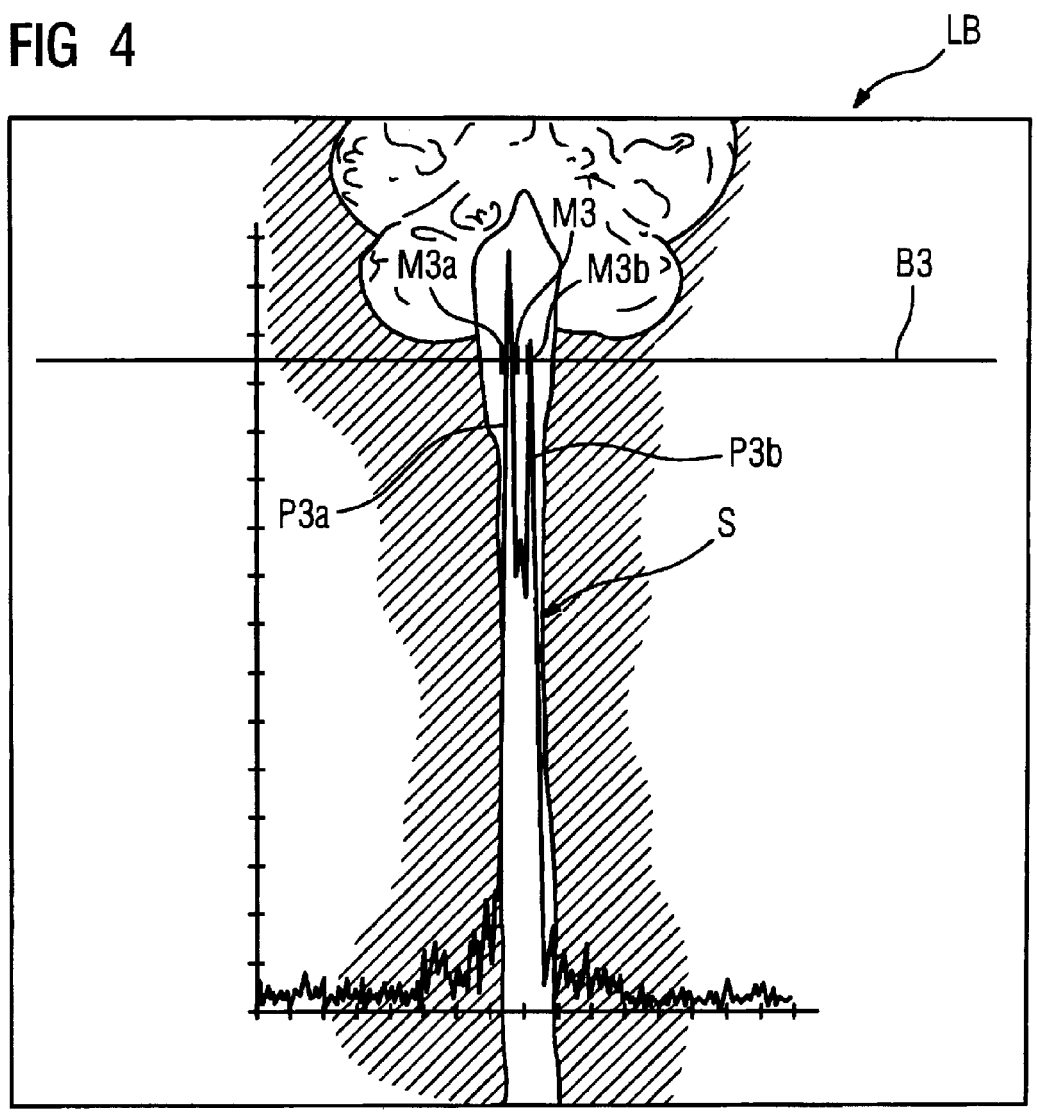

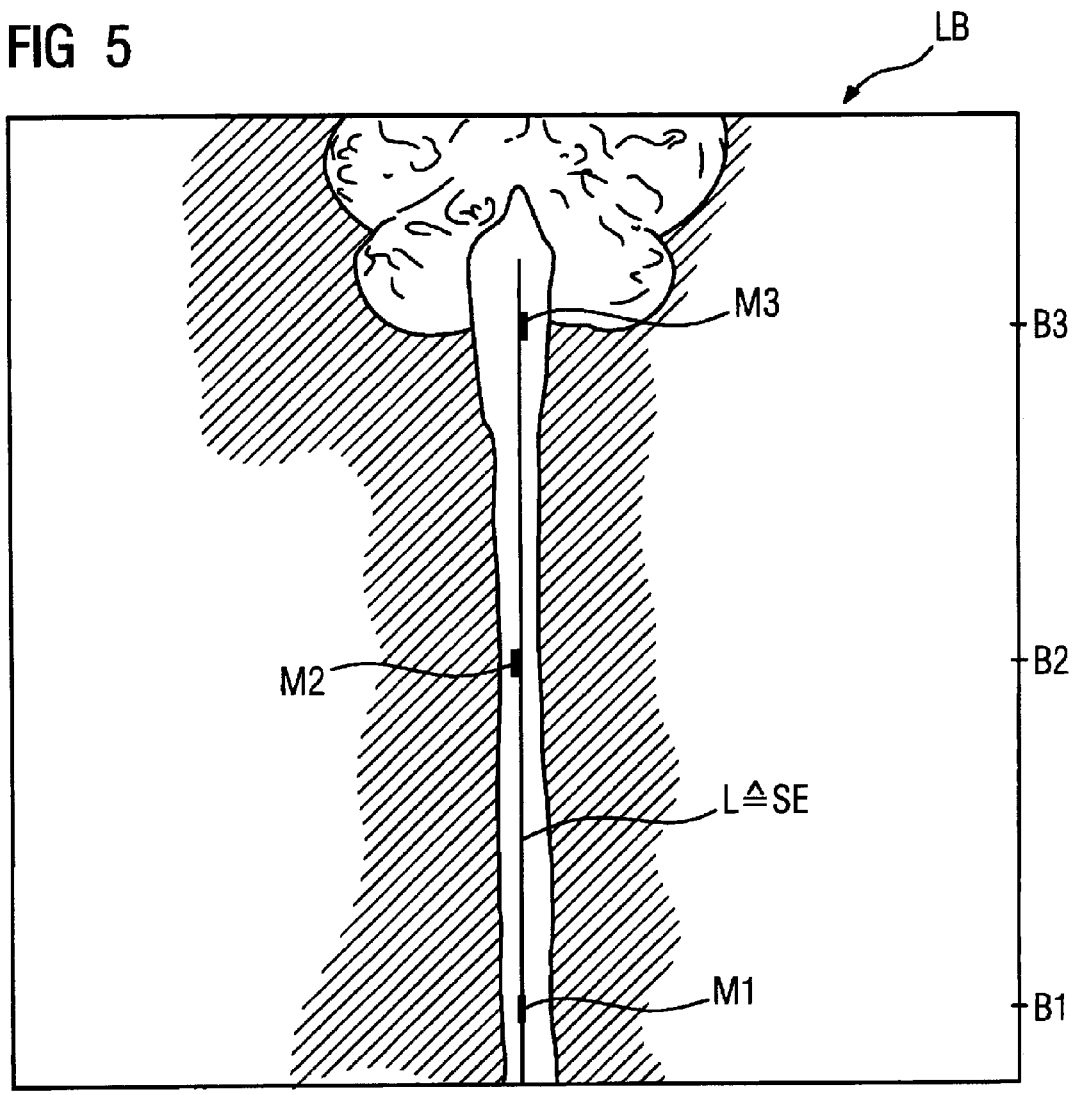

METHOD AND MAGNETIC RESONANCE IMAGING APPARATUS FOR AUTOMATICALLY DETERMINING THE SAGITTAL PLANE OF A SUBJECT

BACKGROUND OF THE INVENTION

1. Field of the Invention

The present invention concerns a method for automatically determining the sagittal plane for the examination regions of an object by means of a magnetic resonance apparatus.

2. Description of the Prior Art

In the acquisition of images of an examination object by means of magnetic resonance, knowledge of the location of certain preferred planes regarding the examination object is important, such as to have knowledge about the relation of the examination object to the coordinate system of the magnetic resonance device, and to exactly define the plane of the slice images that will need to be acquired. Furthermore, knowledge of such distinct planes is important to acquire comparable slice images within the context of repeated examinations.

One such plane is the sagittal plane. Every body plane parallel to the middle plane of the body or the arrow seam of the cranium is encompassed by the term sagittal plane. The determination of the position of the sagittal plane or the sagittal position conventionally ensues manually. This knowledge is used to position the examination object as precisely as possible. For instance a patient whose spinal column is to be examined, in a magnetic resonance device should be positioned by the technician as straight and plane as possible. Subsequently multiple reference exposures are acquired (at times with differing contrasts), for instance with T1, T2, or T2* weighting. The number of exposures (approximately 3-5) are made available to a physician, who used these exposures together with specialized knowledge to determine the position of the sagittal plane or the middle sagittal position by visual assessment. With a crooked spinal column the doctor may attempt tot find either a compromise position, or a compromise position corresponding to guidelines set by the device manufacturer. This procedure is complicated and prone to error, because errors in positioning a patient can be made, leading to assessment problems in subsequent exposures. Moreover, difficulties result sometimes in the image assessment, especially if the exposures are either of poor quality or non-existent or contain insufficiently relevant information for determination of the sagittal position.

SUMMARY OF THE INVENTION

An object of the present invention is to provide of a method that facilitates the determination of the sagittal plane for a of the adjustment process for the acquisition of sagittal slices.

This object is achieved by a method of the type initially described wherein coronal localizer image exposures of the examining region are acquired, on the basis of which an automatic image assessment of the sagittal plane is determined in the image-processing unit of the magnetic resonance apparatus.

The invention achieves a rapid, fully automatic overview image acquisition by an appropriate assessment for the support and simplification of the plane determination, namely a so-called localizer image exposure, by which the relevant examination region is acquired. The image acquisition is processed and evaluated by the image-processing unit of the magnetic resonance apparatus using an appropriate assessment algorithm to determine the middle sagittal image position and tilting of the sagittal plane with respect to the apparatus coordinate system. Thus, it is not necessary to acquire multiple overview exposures as was conventionally done. It is sufficient to make an automatic plane determination by the acquisition of a so-called "single shot turbo spin echo sequence". Furthermore it is not necessary for the doctor to actively determine planes, although it is naturally possible for the physician to participate. For instance, the automatic assessment result can be used in parallel with planes determined by means of a localizer image acquisition. A significant simplification of the plane determination process as well as a significant savings in time result from the method according to the invention.

As noted above, any assessment algorithm for image evaluation of the localizer image acquisition can be used as long as it is appropriate for determining the sagittal position and the resultant sagittal plane. For this purpose the plane determination is made based on analysis of the grayscale value distribution or a brightness distribution In the Image, or in one or multiple specified image regions. Additionally or alternatively it is possible to make the plane determination based on a muster recognition analysis for the ascertainment of anatomical landmarks in the images, or in one or multiple specified image regions. The selection of the algorithm to be used can be made either by the image-processing unit itself as soon as the image-processing unit makes the localizer image acquisitions to be assessed available or at the corresponding input of the examination region to be imaged set by the doctor at the device.

Problems result with regard to the correct and reproducible setting of the sagittal plane particularly in spinal column exposures of the entire spinal column region, as well as in the regions of the cervical spinal column, the thoracic spinal column, as well as the lumbar spinal column. To make the most exact plane determination possible in such examinations, in an embodiment of the invention the spinal column or a section of the spinal column is acquired, so that the liquid-filled spinal column is located in the localizer image. The localizer image acquisition follows, with the liquid-filled region being visually depicted lighter. A sufficiently accurate plane determination (in regard to position) is possible on the basis of the spinal column traversed in the middle by the spinal canal. To acquire images to process for the automatic image assessment, the localizer image is acquired such that the fluid-filled or liquor region is depicted noticeably lighter that the surrounding area. An appropriate setting of the exposure parameters is selected for the acquisition sequence. The effective acquisition time by such localizer exposures should be in the region of approximately one second.

For the purpose of plane determination, at least two image planes (diametrically separated from one another) of the acquired localizer image exposure are assessed with respect to the grayscale value distribution or the brightness distribution and by means of the acquisition technology according to the invention, to visually emphasize the spinal canal, in which at least two transverse image planes are determined by the resultant grayscale value or brightness distribution the sagittal plane. For the most accurate plane determination, the grayscale value or brightness distribution can be ascertained in more than two transverse image planes. By means of the grayscale value or brightness maxima that exist in an ideal positioning of the patient as well as an anatomically ideal, spinal column (free of curvature) along one line, the determination of the maxima position, the corresponding sagittal position or sagittal plane can be accurately ascertained.

It may occur, for instance due to a tilting or a curvature of the spinal column within the image plane in the region of the spinal canal, two or even more grayscale value maxima or brightness maxima exist within the enhanced liquid-filled region of an individual transverse image plane. This can also be associated with the examination region and the position of the planes, for example with an exposure in the region of the cervical spinal column and the position of the transverse image plane near to the transition to the patient's cranium. In this case it is useful, from the two or more grayscale value maxima or brightness maxima, to form a maxima average value possibly with weighing of the individual maxima, and to use this maxima average value in the plane determination. The maxima values or the maxima average value may not align along one connecting line as in the ideal case, especially given tilting of the spinal column, for instance subsequent to a somewhat inaccurate positioning of the patient in the device, or due to an inherent curvature of the spinal column. In such a case the connecting line and thus the resulting actual sagittal plane can be determined by interpolation using the available maxima.

The sagittal plane determination is not only important for the examination of the spinal column, but also in the imaging of other objects, namely, for instance a knee examination. In one such case the automatic sagittal plane determination corresponding to the invention is applied for ascertainment of the rear condyles of the thighbone (femur) as anatomical landmarks. For determining the sagittal plane a line is established connecting both "condyles", for which the perpendicular sections determining the position of the sagittal plane are calculated. Then subsequently the plane determination upon the basis of template pattern recognition and anatomical landmarks, whereby another parameter setting in regards to the localizer image acquisition, is selected.

Primarily the localizer exposure in the form of a T1 measurement and assessment follows here.

It also possible for the coronal plane to be automatically ascertained as well next to the sagittal plane corresponding to the invention, In a spinal column examination, the coronal plane is preferably determined by ascertaining a generally uncurved spinal column region within the inherent S-shape of the spinal column, primarily in the region of the thoracic spinal column. The ascertained connecting line between both condyles provides the coronal plane determination in the case of a knee examination. It is in the determination of the coronal plane to take into account the contribution of the ascertained position data of the sagittal plane as well.

To reliably establish that the examination region, especially in the case of spinal column exposures, actually depicts the entire region relevant for the automatic plane determination, the localizer image acquisition should proceed with a layer thickness of 40 mm through 100 mm, particularly between 60 mm and 80 mm. This is thus a thick-layer coronal exposure, with which it is insured, even in the case of the spinal column exhibiting a curvature of the spinal canal averaging approximately 1 cm in radius that an appropriate image will be available due to the selected layer thickness.

The above object also is achieved in accordance with the invention by a magnetic resonance apparatus having an image acquisition unit for automatic plane determination that operates according to the above-specified method.

DESCRIPTION OF THE DRAWINGS

FIG. 3 is a depiction (proceeding from FIG. 2) with the grayscale value or brightness distribution in a second transverse image plane.

FIG. 4 is a depiction (proceeding from FIG. 3) with the grayscale value or brightness distribution in a third transverse image plane.

FIG. 5 illustrates the determination of the position of the mediosagittal slice plane using the ascertained maxima in accordance with the invention.

DESCRIPTION OF THE PREFERRED EMBODIMENTS

Figure 1:
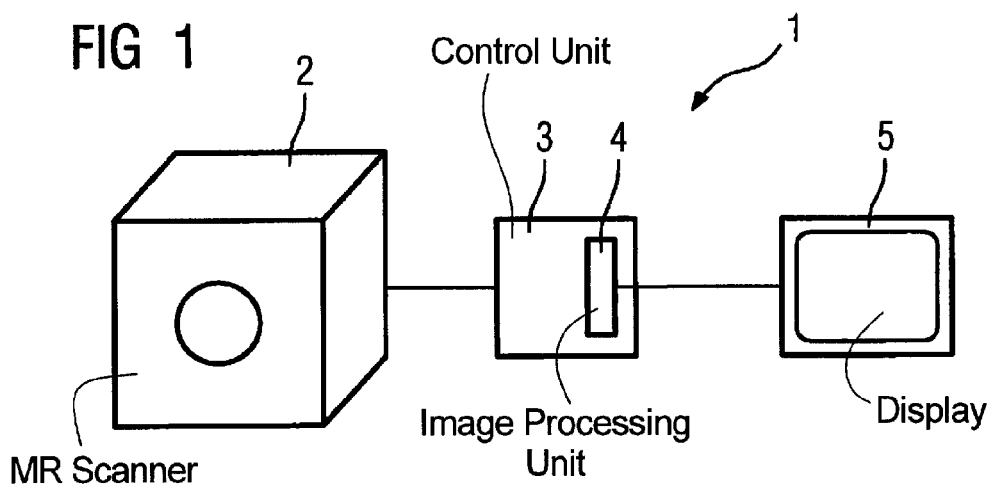
FIG. 1 schematically shows the basic components of a magnetic resonance apparatus corresponding to the invention.

FIG. 1 depicts a magnetic resonance apparatus 1 corresponding to the invention having an MR scanner 2, in which a patient can be placed as well as a control unit 3 (that controls the entire device) with integrated image-processing unit 4, that is used for the image acquisition as well as image processing and assessment and execution of the method of the Invention. A monitor 5 is provided at which images produced by the apparatus 1 can be displayed.

The image-processing device 4 executes the method according to the invention for the automatic sagittal plane determination. For this purpose, a localizer image exposure in the form of a thick-layer coronal single shot turbo spin-echo localizer exposure is acquired, This image is acquired with a coronal setting in a layer thickness of, for example 60-80 mm for a fixed layer position, i.e. without manual layer positioning. The field of view, and thus the image acquisition region, corresponds to tho usual user measurements, but can be somewhat smaller, depending on the examination region to be acquired. A larger field of view can be set for spinal column curvatures that are expected to be large.

For the acquisition of the spinal column under depiction of the visually highlighted or emphasized spinal canal for the later image assessment, the operating parameters of the image acquisition are correspondingly set for the later image assessment. For a quick image acquisition a TE value of approximately 500 ms is set A spectral fat saturation setting can be dispensed so as to make the measurement quickly, without the image quality suffering.

Figure 2:
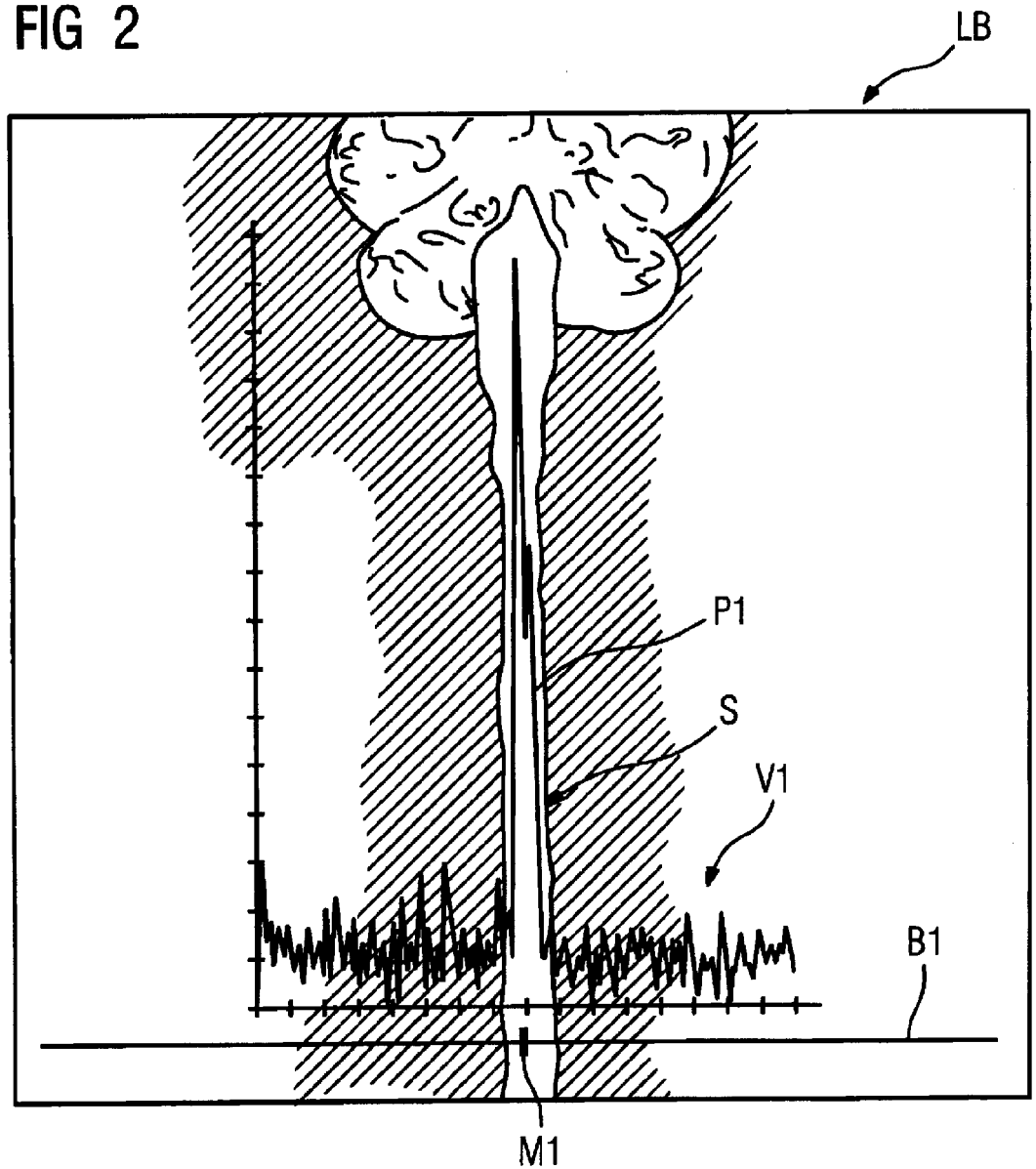
FIG. 2 is a depiction of a spinal column region acquired in accordance with the invention, with the spinal canal emphasized and a grayscale value or brightness profile, in an initial transverse image plane.

After acquiring the very short localizer data, for which approximately 2 seconds is the effective acquisition time, the exemplary image shown in FIG. 2 results as a displayed image. This is evaluated for the automatic determination of the sagittal plane in the image-processing device 4. For this purpose the grayscale values or intensity or brightness profiles of the pixels of the digital image are identified and electronically analyzed in different transverse image planes.

FIG. 2 depicts the grayscale value or intensity profile V1, which is acquired by an assessment of the pixel content for the transverse image plane B1. A strong peak P1, i.e., a distinctive maximum in the region of the spinal canal S for the position of the image plane B1, (the position of which is indicated in the image by the line marked B1) is identified with M1.

FIG. 3 depicts the acquired localizer image LB of FIG. 2, wherein the grayscale value or brightness distribution V2 is acquired as well for a second image plane B2, depicted by the corresponding transverse line B2. Here as well, a distinctive peak P2 with a maximum M2 exists at the indicated position along the line of image plane B2 in the region of the spinal canal S.

FIG. 4 illustrates the application of the inventive method for the image plane B3 in the localizer image LB. Here, however two distinctive peaks P3a and P3b, which have respective maxima M3a and M3b, are depicted in the region of the spinal canal S. From these maxima M3a and M3b (possibly with differing weighing, for instance dependent on the strength of the peaks) a maxima average value M3 is derived; as is shown along the line for transverse plane 13.

From FIG. 5 it can be seen, how the position of the sagittal plane is acquired from the maxima. Depicted again is the localizer image LB, wherein, in addition to the image planes B1, B2, and B3, the respective maxima M1, M2, and M3 are shown. In the example shown all three maxima M1, M2, and M3 are located substantially along a common connecting line L, which simultaneously defines the sagittal plane or level SE perpendicular to it. In the specified manner the middle of the spinal column section and the tilting of the optimal sagittal direction of the sagittal plane can be ascertained acquisition of the intensity value maxima or grayscale value maxima possibly with weighted algorithmic assessment of the individual profiles, automatically and quickly. The ascertained slice position of the middle of the spinal column section and any tilting are copied to the user protocol for subsequent slice image exposures. That is, the mediosagittal gradient of the spinal canal (acquired by such means) and therewith the middle of the sagittal layer, serve as setting parameters for additional image exposures.

As specified, the maxima M1, M2, and M3 shown in FIG. 5 exist ideally nearly along one connection line L. If the spinal column is more strongly curved or is tilted, the maxima will not necessary exist along a common line, but may be spaced therefrom. A line determination by interpolation, possibly with the maxima suitably weighted, i.e. with the positions of individual maxima being given differing strengths is used to ascertain the line L and subsequently the position of the sagittal plane SE.

By means of the ascertained position parameters for the sagittal plane SE it is also possible to determine the position of the coronal plane for the examination region. For spinal column exposures such as the thoracic spinal column, wherein larger, relatively straight, spinal column sections exist; the coronal plane proceeds perpendicularly to the sagittal plane.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for automatically determining the sagittal plane of a subject comprising the steps of:
   with a magnetic resonance imaging apparatus, having an image-processing unit associated therewith, acquiring data from a subject in the magnetic resonance imaging apparatus representing a substantially coronal localizer image containing the spinal column of the subject depicted with a visual emphasis; and
   in said image-processing unit, using said visual emphasis to automatically electronically analyze said localizer image to determine the sagittal plane of the subject by identifying a maximum of a distribution in said image, selected from the group consisting of a grayscale value distribution and a brightness distribution, in each of two transverse planes, separated from each other, and identifying a line connecting the maxima.

2. A method as claimed in claim 1 comprising determining said sagittal plane by electronically analyzing a distribution, in at least one region of said image, selected from the group consisting of a grayscale value distribution and a brightness distribution.

3. A method as claimed in claim 1 comprising determining said sagittal plane by electronic pattern recognition analysis of said image to identify anatomical landmarks in at least a region of said image.

4. A method as claimed in claim 1 comprising, in at least one of said transverse planes, identifying at least two maxima, forming an average maximum value of said at least two maxima, and using said average maximum value as the maximum of said distribution in said at least one of said transverse planes.

5. A method as claimed in claim 1 comprising determining said line by interpolation.

6. A method as claimed in claim 1 comprising, in addition to said sagittal plane, automatically electronically determining the coronal plane in said image-processing unit from the sagittal plane determined in said localizer image.

7. A method as claimed in claim 6 comprising acquiring said localizer image of a region of the examination subject containing a substantially curvature-free region of the spinal column, and determining said coronal plane from the sagittal plane determined in said substantially curvature-free region of said spinal column.

8. A method as claimed in claim 7 comprising additionally employing position data of said sagittal plane for automatically electronically determining said coronal plane.

9. A method as claimed in claim 1 comprising obtaining said localizer image in a scan of the examination subject having a slice thickness in a range between 40 mn to 100 mm.

10. A method as claimed in claim 9 comprising acquiring to said localizer image in a scan of said examination subject with a slice thickness in a range between 60 mm and 80 mm.

11. A method for automatically determining the sagittal plane of a subject, comprising the steps of:
    with a magnetic resonance imaging apparatus having an image processing unit associated therewith, acquiring data from a subject in the magnetic resonance imaging apparatus representing a substantially coronal localizer image containing a knee of the subject; and
    in said image processing unit, automatically electronically analyzing said localizer image to determine the sagittal plane of the subject by identifying the rear Condyles of a femur of the subject as anatomical landmarks, and determining said sagittal plane by identifying a line connecting said rear condyles and determining said sagittal plane as being at a right angle in said image to said line.

12. A method as claimed in claim 11 comprising, in addition to said sagittal plane, automatically electronically determining the coronal plane in said image-processing unit from the sagittal plane determined in said localizer image.

13. A method as claimed in claim 12 comprising automatically electronically determining said coronal plane as a plane proceeding perpendicular to said localizer image and containing a line connecting the condyles of a femur in said localizer image.

14. A magnetic resonance apparatus for automatically determining the sagittal plane of a subject, comprising:
    a magnetic resonance imaging scanner having an image processing unit associated therewith, configured to acquire magnetic resonance data from a subject in the magnetic resonance imaging apparatus representing a substantially coronal localizer image containing the spinal column of the subject depicted with a visual emphasis; and said image processing unit being configured to automatically analyze said localizer image to determine the sagittal plane of the subject by identifying a maximum of a distribution in said image, selected from the group consisting of a gray scale value distribution and a brightness distribution, in each of two transverse planes, separated from each other, and identifying a line connecting the maxima.

15. A magnetic resonance apparatus for automatically determining the sagittal plane of a subject, comprising:

a magnetic resonance imaging scanner having an image processing unit associated therewith, configured to acquire magnetic resonance data from a subject in the magnetic resonance scanner representing a substantially coronal localizer image containing a knee of the subject; and said image processing unit being configured to automatically analyze said localizer image to determine the sagittal plane of the subject by electronically identifying the rear condyles of a femur of the subject as anatomical landmarks, and by identifying a line connecting the rear condyles and determining said sagittal plane as being at a right angle in said image to said line.

* * * * *